(12) United States Patent
Guerrero, Jr.

(10) Patent No.: US 11,782,473 B2
(45) Date of Patent: Oct. 10, 2023

(54) INDUCTIVE JOYSTICK

(71) Applicant: Razer (Asia-Pacific) Pte. Ltd., Singapore (SG)

(72) Inventor: Gil Palma Guerrero, Jr., Singapore (SG)

(73) Assignee: Razer (Asia-Pacific) Pte. Ltd., Singapore (SG)

( * ) Notice: Subject to any disclaimer, the term of this patent is extended or adjusted under 35 U.S.C. 154(b) by 285 days.

(21) Appl. No.: 17/426,340

(22) PCT Filed: Jan. 31, 2019

(86) PCT No.: PCT/SG2019/050053
§ 371 (c)(1),
(2) Date: Jul. 28, 2021

(87) PCT Pub. No.: WO2020/159433
PCT Pub. Date: Aug. 6, 2020

(65) Prior Publication Data
US 2022/0091629 A1 Mar. 24, 2022

(51) Int. Cl.
*G05G 9/047* (2006.01)
*G05G 1/015* (2008.04)
(Continued)

(52) U.S. Cl.
CPC ............. *G05G 9/047* (2013.01); *G05G 1/015* (2013.01); *H01F 38/14* (2013.01); *H05K 1/181* (2013.01);
(Continued)

(58) Field of Classification Search
CPC ......... G05G 9/047; G05G 2009/04766; G05G 2009/04755; G05G 1/015; G05G 1/08; H05K 2201/1003
See application file for complete search history.

(56) References Cited

U.S. PATENT DOCUMENTS

| | | | |
|---|---|---|---|
| 4,161,726 A * | 7/1979 | Burson | G05G 9/047 341/20 |
| 4,459,578 A * | 7/1984 | Sava | G05G 9/047 345/161 |

(Continued)

FOREIGN PATENT DOCUMENTS

| | | |
|---|---|---|
| CN | 1551270 A | 12/2004 |
| CN | 101315569 A | 12/2008 |

(Continued)

OTHER PUBLICATIONS

China Office Action dated Jun. 6, 2022 for corresponding China Application No. 201980094054.X (35 pages).
(Continued)

*Primary Examiner* — Daniel D Yabut
(74) *Attorney, Agent, or Firm* — Polsinelli PC (57) ABSTRACT

An inductive joystick may include a control structure including an elongate member movable along at least one direction substantially perpendicular to its length; and a position sensing assembly including a printed circuit board having at least one surface arranged adjacent to the control structure and at least one metal dial arranged over the at least one surface. The at least one surface may be substantially parallel with the elongate member's length and with the at least one direction, and may be provided with at least one transmitter coil and at least one receiver coil. In use, the transmitter coil(s) may induce signal(s) in the receiver coil(s) and the metal dial(s) may interfere with the induction. Moving the elongate member may cause relative movement between the surface(s) and the metal dial(s) which may vary the induced signal(s) based on a position of the metal dial(s).

20 Claims, 8 Drawing Sheets

(51) Int. Cl.
 *H01F 38/14* (2006.01)
 *H05K 1/18* (2006.01)
 *G05G 1/08* (2006.01)

(52) U.S. Cl.
 CPC ..... *G05G 1/08* (2013.01); *G05G 2009/04766* (2013.01); *H05K 2201/1003* (2013.01)

(56) References Cited

U.S. PATENT DOCUMENTS

| | | | | |
|---|---|---|---|---|
| 4,879,556 | A * | 11/1989 | Duimel | G01D 5/2073 341/20 |
| 5,450,054 | A * | 9/1995 | Schmersal | F16H 59/044 74/471 XY |
| 5,911,627 | A | 6/1999 | Piot et al. | |
| 5,959,863 | A | 9/1999 | Hoyt et al. | |
| 6,043,806 | A * | 3/2000 | Atwell | G01D 5/2053 345/161 |
| 6,248,018 | B1 * | 6/2001 | Kehlstadt | G05G 9/047 345/161 |
| 6,445,311 | B1 | 9/2002 | Hohl et al. | |
| 6,480,183 | B1 * | 11/2002 | Van Ruymbeke | G05G 9/047 324/660 |
| 6,538,639 | B1 * | 3/2003 | Takahashi | G05G 9/047 345/161 |
| 7,019,238 | B2 | 3/2006 | Kobayashi | |
| 7,538,544 | B2 | 5/2009 | Lee | |
| 7,705,585 | B2 | 4/2010 | Howard et al. | |
| 7,821,500 | B2 | 10/2010 | Wedel et al. | |
| 7,932,715 | B2 | 4/2011 | Howard et al. | |
| 8,020,453 | B2 | 9/2011 | Kreit | |
| 8,829,894 | B2 | 9/2014 | Banerjee et al. | |
| 9,945,653 | B2 | 4/2018 | Howard et al. | |
| 10,386,883 | B2 | 8/2019 | Inoue et al. | |
| 2002/0056621 | A1 * | 5/2002 | Nakai | G05G 9/047 200/61.39 |
| 2003/0107502 | A1 | 6/2003 | Alexander et al. | |
| 2004/0206611 | A1 | 10/2004 | Kobayashi | |
| 2004/0227727 | A1 * | 11/2004 | Schena | G05G 9/047 345/156 |
| 2008/0280640 | A1 | 11/2008 | Wedel et al. | |
| 2011/0140690 | A1 * | 6/2011 | Antraygue | B64C 13/042 324/207.25 |
| 2016/0216726 | A1 | 7/2016 | Inoue et al. | |

FOREIGN PATENT DOCUMENTS

| | | | |
|---|---|---|---|
| CN | 102346498 A | 2/2012 | |
| CN | 204925865 U | 12/2015 | |
| CN | 105518565 A | 4/2016 | |
| DE | 102008022850 A1 * | 5/2009 | ............ G05G 9/047 |
| EP | 0352417 A2 | 1/1990 | |
| EP | 1751645 A2 | 2/2007 | |
| JP | 2001-109535 A | 4/2001 | |
| JP | 2007-004703 A | 1/2007 | |
| JP | 2008 299755 A | 11/2008 | |
| KR | 10-2005-0111683 A | 11/2005 | |

OTHER PUBLICATIONS

Extended European Search Report dated Jan. 28, 2022, 9 pages, for the corresponding European Patent Application No. 19912937.0.
International Search Report and Written Opinion, dated Oct. 30, 2019, for the corresponding International Application No. PCT/SG2019/050053 in 10 pages.
Chau, Simon Yi Ying, Six Degree of Freedom Joystick, Masters Theses and Dissertations: University of Canterbury, Oct. 6, 2003 (http://hdl.handle.net/10092/6604) in 176 pages.

* cited by examiner

INDUCTIVE JOYSTICK

TECHNICAL FIELD

Various embodiments generally relate to a joystick. In particular, various embodiments generally relate to an inductive joystick.

BACKGROUND

Joysticks are widely used in gaming consoles and personal computer (PC) controllers. To date, joysticks mostly operate using potentiometers. For example, a joystick typically includes a mid rod connected to a spring contact movable along a resistive element. When the mid rod is at rest, the spring contact is at a reference position approximately in a middle of the resistive element. As the mid rod moves, the spring contact moves with the mid rod away from the reference position. This causes a voltage change between the spring contact and one end of the resistive element. A calibration firmware is used to set the reference position as corresponding to a zero value and to create a map indicative of the relationship between the positions of the mid rod and the corresponding voltage changes. When the joystick is in use, the map is used to translate the measured voltage changes (in analogue form) to positions of the mid rod (in digital form). Thus, movement of the mid rod by a user may be determined. Such movement may represent directional movement in a game as desired by the user. For example, a user wanting to move a game character in a north or south direction or in an upwards or downwards direction may move the mid rod towards a positive or negative Y direction. As the mid rod may not always return to the initial rest position after it is moved, a circular area around the initial rest position may be set as a dead zone, where the map may translate the position of the mid rod as the initial rest position whenever the mid rod is within this dead zone.

Joysticks operating using potentiometers often suffer from component tolerance variations where the voltage changes between the spring contact and one end of the resistive element can vary over a range even when the mid rod is moved to a same position. This therefore causes inconsistencies and errors in determining the position of the mid rod. Another typical problem with joysticks operating using potentiometers is that they often have short lifespans. This is because such joysticks often use carbon as the resistive element which is prone to early wear and tear due to frequent contact between the resistive element and other components (e.g. the spring contact) causing abrasion to the resistive element. When carbon layers of the resistive element start to wear out, the resistance of the resistive element deviates from its original value. In turn, the voltage changes caused by the movement of the spring contact along the resistive element deviate from the values in the map originally registered by the calibration firmware. Accordingly, the translation of the voltage changes to the mid rod's movement using the map becomes inaccurate. In some cases, the originally created map may even translate the initial rest position of the mid rod as being out of the dead zone. Such a phenomenon (often known as joystick drifting) can adversely affect the user's experience. For example, a character in a game may move even when the user is not moving the mid rod.

Accordingly, there is a need for an improved joystick which may have longer lifespans and lower component tolerance variations.

SUMMARY

According to various non-limiting embodiments, there may be provided an inductive joystick. The inductive joystick may include a control structure that may include an elongate member movable along at least one direction substantially perpendicular to a length of the elongate member. The inductive joystick may further include a position sensing assembly that may include a printed circuit board and at least one metal dial. The printed circuit board may have at least one surface arranged adjacent to the control structure. The at least one surface may be substantially parallel with the length of the elongate member and with the at least one direction. The at least one metal dial may be arranged over the at least one surface. The control structure may be coupled with the position sensing assembly such that movement of the elongate member along the at least one direction may cause relative movement between the at least one surface and the at least one metal dial. The at least one surface of the printed circuit board may be provided with at least one transmitter coil and at least one receiver coil. The at least one transmitter coil may be configured to induce at least one signal in the at least one receiver coil, and the at least one metal dial may be configured to interfere with the induction of the at least one signal such that relative movement between the at least one surface and the at least one metal dial may vary the at least one induced signal based on a position of the at least one metal dial.

According to various embodiments, there may be provided an inductive joystick. The inductive joystick may include a control structure that may include an elongate member movable along a first direction and a second direction; and a position sensing assembly that may include a printed circuit board, a first metal dial and a second metal dial. The first and second directions may be substantially perpendicular to a length of the elongate member. The printed circuit board may have a first surface and a second surface arranged adjacent to the control structure. The first and second surfaces may be substantially parallel with the length of the elongate member and with the first and second directions respectively. The first surface may be coupled with the second surface such that the printed circuit board may surround at least part of the control structure. The first metal dial may be arranged over the first surface and the second metal dial may be arranged over the second surface. Each of the first and second surfaces may be provided with at least one transmitter coil and at least one receiver coil. The control structure may be coupled with the position sensing assembly such that movement of the elongate member along the first or second direction may cause relative movement between the surface parallel with the direction and the metal dial arranged over the surface. For each of the first and second surfaces, the at least one transmitter coil may be configured to induce at least one signal in the at least one receiver coil, and the at least one metal dial may be configured to interfere with the induction of the at least one signal such that relative movement between the surface and the metal dial may vary the at least one induced signal based on a position of the metal dial.

According to various embodiments, there may be provided an inductive joystick. The inductive joystick may include a control structure that may include an elongate member movable along at least one direction substantially perpendicular to a length of the elongate member; and a position sensing assembly that may include a printed circuit board and at least one metal dial. The printed circuit board may have at least one surface arranged adjacent to the control structure, and the at least one surface may be substantially parallel with the length of the elongate member and with the at least one direction. The at least one metal dial may be arranged over the at least one surface. The at least one metal dial may be connected to the control structure such that movement of the elongate member along the at least one direction may cause movement of the at least one metal dial over the at least one surface. The at least one surface of the printed circuit board may be provided with at least one transmitter coil and at least one receiver coil. The at least one transmitter coil may be configured to induce at least one signal in the at least one receiver coil, and the at least one metal dial may be configured to interfere with the induction of the at least one signal such that movement of the at least one metal dial over the at least one surface may vary the at least one induced signal based on a position of the at least one metal dial.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various embodiments generally relate to a joystick for communication with a processor-based device. The processor or the processor-based device may be a host computer running an application, and sending signals to and/or receiving signals from the joystick. The signals received from the joystick may be used to control another application such as a game, for example, control movement of characters in the game. In various embodiments, the joystick may be configured to use contactless sensing. In various embodiments, the joystick may be configured to use inductive positioning sensor technology. In various embodiments, the joystick may include an elongate member and a position sensing assembly configured to operate based on inductive coupling between coils. In various embodiments, the joystick may include at least one metal dial configured to interfere with the inductive coupling. In various embodiments, the at least one metal dial may be arranged over a surface on which the coils may be provided. In various embodiments, the at least one metal dial may not contact the surface. By using such contactless sensing, the amount of contact between components of the joystick may be reduced, in turn reducing wear and tear in the joystick and increasing the lifespan of the joystick.

Figure 1A:
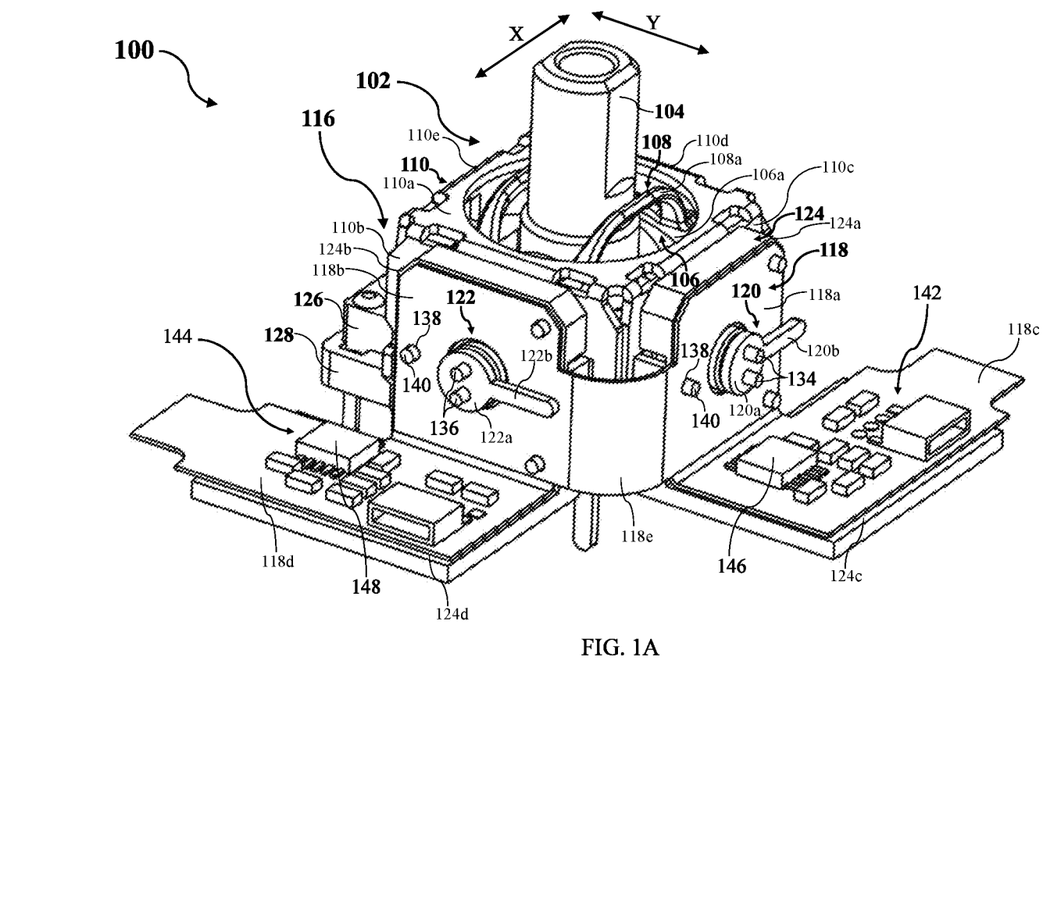
FIG. 1A shows a perspective view of an inductive joystick according to various embodiments and FIG. 1B shows an exploded view of the inductive joystick of FIG. 1A.
Figure 1B:
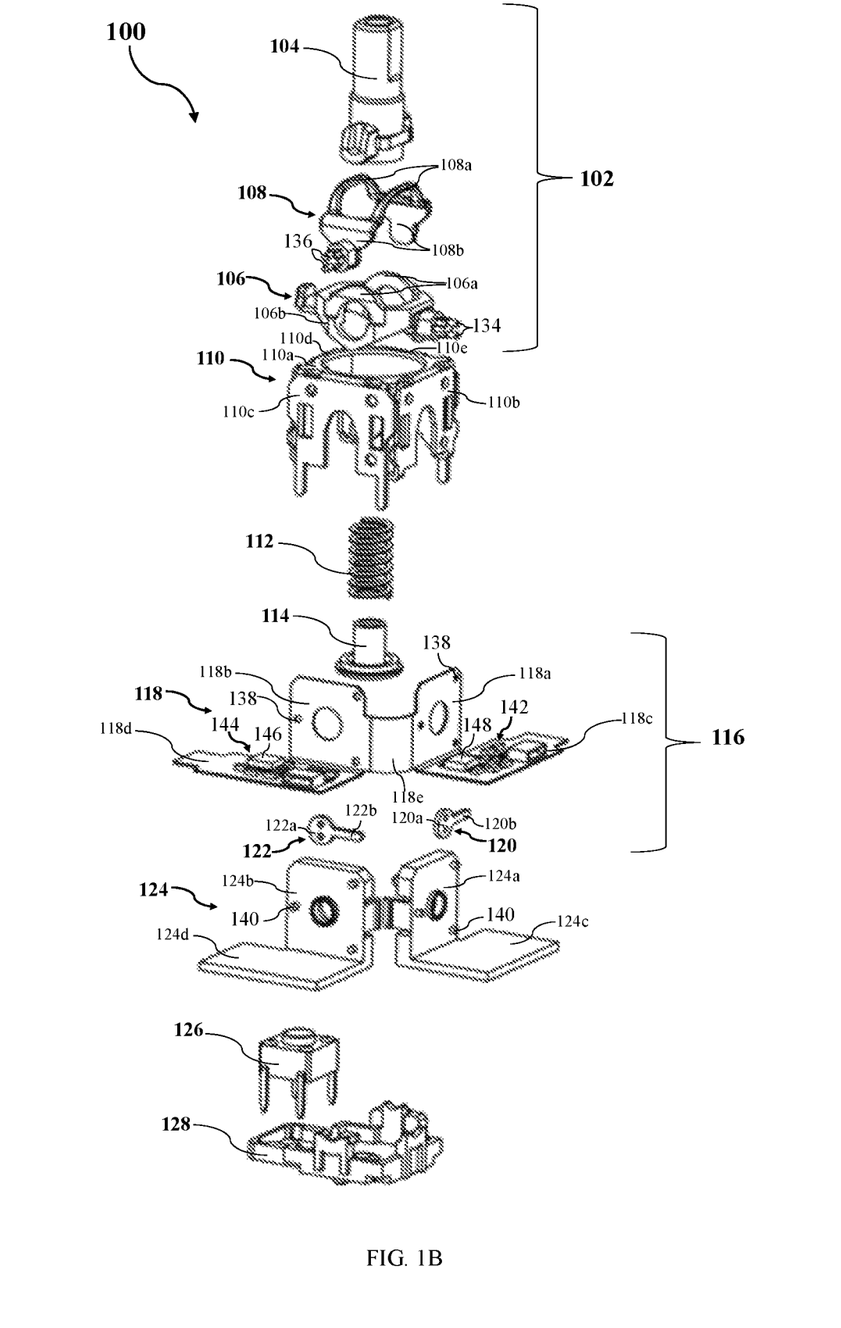

FIG. 1A shows a perspective view of an inductive joystick 100 according to various embodiments and FIG. 1B shows an exploded view of the inductive joystick 100.

As shown, in various embodiments, the inductive joystick 100 may include a control structure 102. The control structure 102 may include an elongate member 104. As shown, in various embodiments, the elongate member 104 may be movable along a first direction (X direction) and a second direction (Y direction), where the first and second directions may be substantially perpendicular to a length of the elongate member 104. As shown, in various embodiments, the control structure 102 may further include a first shaft 106 that functions as an X shaft and a second shaft 108 that functions as a Y shaft. The first shaft 106 may be configured to rotate about a first axis substantially perpendicular to the first direction (X direction) and the second shaft 108 may be configured to rotate about a second axis substantially perpendicular to the second direction (Y direction). As shown, in various embodiments, the first shaft 106 may include a pair of arched elements 106a connected to each other via an intermediate element 106b. The arched elements 106a and the intermediate element 106b of the first shaft 106 may be arranged to define an opening at the top of the shaft 106 and a pair of circular holes at opposite sides of the shaft 106. As shown, in various embodiments, the second shaft 108 may include a pair of arched elements 108a, each arched element 108a connected to an end element 108b. The arched elements 108a and the end elements 108b of the second shaft 108 may be arranged to define an opening at the top of the shaft 108. In various embodiments, the shafts 106, 108 may be arranged with the elongate member 104 such that the elongate member 104 extends through the openings at the top of the shafts 106, 108. In various embodiments, the first shaft 106 may be arranged with the second shaft 108, such that the arched elements 106a of the first shaft 106 are substantially orthogonal to the arched elements 108a of the second shaft 108. Further, the ends of the second shaft 108 may be arranged to extend through the circular holes of the first shaft 106. As shown, in various embodiments, the first shaft 106 may include a plurality of pins 134 at one end and the second shaft 108 may include a plurality of pins 136 at one end. However, in alternative embodiments, the first and second shafts 106, 108 may each include only a single pin. In various embodiments, the pins 134, 136 may be plastic pins, but other materials may also be used to form the pins.

As shown, in various embodiments, the inductive joystick 100 may further include a housing structure or a support structure 110 surrounding the control structure 102. For example, the support structure 110 may include a top plate 110a and a plurality of side plates 110b, 110c, 110d, 110e arranged around the control structure 102, where adjacent side plates 110b, 110c, 110d, 110e may be substantially perpendicular to each other. As shown, a first side plate 110b may include a dome-shaped recess to allow the end of the first shaft 106 including the pins 134 to extend through. The other end of the first shaft 106 may be pivotably connected to a third side plate 110d opposite the first side plate 110b, so that the first shaft 106 may be rotatable relative to the third side plate 110d about an axis substantially perpendicular to the first direction (X direction). Similarly, as shown, the second side plate 110c may also include a dome-shaped recess to allow the end of the second shaft 108 including the pins 136 to extend through. The other end of the second shaft 108 may be pivotably connected to a fourth side plate 110e opposite the second side plate 110c, so that the second shaft 108 may be rotatable relative to the fourth side plate 110e about an axis substantially perpendicular to the second direction (Y direction). In various embodiments, the support structure 110 may be in the form of a meta case.

In various embodiments, the inductive joystick 100 may further include a position sensing assembly 116. The position sensing assembly 116 may include a printed circuit board 118, a first metal dial 120 and a second metal dial 122.

As shown, in various embodiments, the position sensing assembly 116 may include a printed circuit board 118 having a first surface 118a and a second surface 118b arranged adjacent to the control structure 102. Each surface 118a, 118b may include a circular hole substantially in a middle of the surface 118a, 118b to allow the ends of the shafts 106, 108 including the pins 134, 136 to extend through. As shown, the first and second surfaces 118a, 118b may be substantially parallel with the length of the elongate member 104 and with the first and second directions (X and Y directions) respectively. The first surface 118a may be coupled with the second surface 118b such that the printed circuit board 118 surrounds at least part of the control structure 102. For example, the printed circuit board 118 may include a connecting member 118e connecting the first and second surfaces 118a, 118b. As one example, the connecting member 118e may be curved (as shown in FIG. 1A) so that the first and second surfaces 118a, 118b are substantially perpendicular to each other. The printed circuit board 118 may be formed of a rigid material in some embodiments and may be formed of a flexible material in other embodiments. For example, the printed circuit board 118 may include a flex cable. In various embodiments, each of the first and second surfaces 118a, 118b of the printed circuit board 118 may be provided with at least one transmitter coil and at least one receiver coil. In various embodiments, the at least one transmitter coil and the at least one receiver coil may be embedded on the printed circuit board 118. For example, the at least one transmitter coil and the at least one receiver coil may be in the form of traces on the printed circuit board 118. The at least one transmitter coil and the at least one receiver coil will be further discussed below with reference to FIGS. 2A and 2B.

As shown, in various embodiments, the joystick 100 may further include a plurality of electrical components 142, 144. As shown, the plurality of electrical components 142, 144 may include a first chip 146 and a second chip 148. The first and second chips 146, 148 may be sensor chips. The chips 146, 148 will be further discussed below with reference to FIG. 3. In various embodiments, the printed circuit board 118 may further include at least one extension member extending from at least one of the first and second surfaces 118a, 118b to hold the plurality of electrical components 142, 144. For example, as shown, the printed circuit board 118 may include a first extension member 118c extending from the first surface 118a to hold a first plurality of electrical components 142 and a second extension member 118d extending from the second surface 118b to hold a second plurality of electrical components 144. The first plurality of electrical components 142 may be for use with the first surface 118a of the printed circuit board 118 and the second plurality of electrical components 144 may be for use with the second surface 118b of the printed circuit board 118. However, the printed circuit board 118 may alternatively include only a single extension member extending from either the first surface 118a or the second surface 118b for holding the electrical components 142, 144. In various embodiments, the extension member 118c/118d may be substantially perpendicular to the surface 118a/118b from which the extension member 118c/118d extends.

As shown, in various embodiments, the position sensing assembly 116 may include a first metal dial 120 arranged over the first surface 118a of the printed circuit board 118, and a second metal dial 122 arranged over the second surface 118b of the printed circuit board 118. In various embodiments, the first and second metal dials 120, 122 may not contact the first and second surfaces 118a, 118b respectively. In other words, the metal dials 120, 122 may be contactless dials. As shown, in various embodiments, the first metal dial 120 may include a base portion 120a and an elongate element 120b extending from the base portion 120a, and the second metal dial 122 may include a base portion 122a and an elongate element 122b extending from the base portion 122a. However, in alternative embodiments, the metal dials 120, 122 may be of a different shape from that shown in the figures. The sizes and materials for forming the metal dials 120, 122 may also vary in different embodiments. Further, the metal dials 120, 122 may be referred to as pin dials in various embodiments.

In various embodiments, the control structure 102 may be coupled with the position sensing assembly 116 such that movement of the elongate member 104 along the first or second direction (X or Y direction) causes relative movement between the surface (118a or 118b) parallel with the direction and the metal dial (120 or 122) arranged over the surface (118a or 118b). For example, the first and second metal dials 120, 122 may be connected to the control structure 102 such that movement of the elongate member 104 along the first direction (X direction) causes movement of the first metal dial 120 over the first surface 118a and movement of the elongate member 104 along the second direction (Y direction) causes movement of the second metal dial 122 over the second surface 118b. In various embodiments, the base portions 120a, 122a of the first and second metal dials 120, 122 may be connected to the control structure 102. In various embodiments, the first and second metal dials 120, 122 may be connected to the first and second shafts 106, 108 respectively. For example, the base portion 120a of the first metal dial 120 may be connected to the first shaft 106, and the base portion 122a of the second metal dial 122 may be connected to the second shaft 108. In various embodiments, movement of the elongate member 104 along the first direction may urge the elongate member 104 against one of the arched elements 106a of the first shaft 106 to rotate the first shaft 106. Rotation of the first shaft 106 may cause rotation of the base portion 120a of the first metal dial 120 to move the elongate element 120b of the first metal dial 120 over the at least one transmitter coil and the at least one receiver coil of the first surface 118a. Similarly, movement of the elongate member 104 along the second direction may urge the elongate member 104 against one of the arched elements 108a of the second shaft 108. Rotation of the second shaft 108 may cause rotation of the base portion 122a of the second metal dial 122 to move the elongate element 122b of the second metal dial 122 over the at least one transmitter coil and the at least one receiver coil of the second surface 118b. However, the control structure 102 need not be coupled with the position sensing assembly 106 by connecting the metal dials 120, 122 to the control structure 102. Instead, the printed circuit board 118 may be connected to the control structure 102 such that movement of the elongate member 104 causes relative movement between the surfaces 118a, 118b and the respective metal dials 120, 122 over the surfaces 118a, 118b.

In various embodiments, the pins 134/136 located at ends of the shafts 106, 108 may connect the first and second metal dials 120, 122 to the control structure 102. As shown, the base portion 120a, 122a of each metal dial 120, 122 may include holes at locations corresponding to the locations of the pins 134, 136 of the first and second shafts 106, 108. To connect the metal dials 120, 122 to the control structure 102, the pins 134 of the first shaft 106 may be arranged through the holes of the base portion 120a of the first metal dial 120 and the pins 136 of the second shaft 108 may be arranged through the holes of the base portion 122a of the second metal dial 122. The pins 134, 136 may then be heat staked to secure the first and second metal dials 120, 122 to the first and second shafts 106, 108 respectively.

As shown, in various embodiments, the inductive joystick 100 may further include a reinforcing member 124 connected between the printed circuit board 118 and the support structure 110. In various embodiments, the reinforcing member 124 may be in the form of a flex bracket. The reinforcing member 124 may include a first surface 124a and a second surface 124b arranged substantially perpendicular to each other and connected to each other via a hinge. The reinforcing member 124 may further include a first extension member 124c extending from the first surface 124a and substantially perpendicular to the first surface 124a, and a second extension member 124d extending from the second surface 124b and substantially perpendicular to the second surface 124b. The first and second surfaces 124a, 124b of the reinforcing member 124 may each include a circular hole substantially in the middle of the surface 124a, 124b to allow the ends of the shafts 106, 108 including the pins 134, 136 to extend through. As shown, in various embodiments, the first and second surfaces 118a, 118b of the printed circuit board 118 may be arranged over the first and second surfaces 124a, 124b of the reinforcing member 124 respectively such that the circular holes of the overlapping surfaces (surfaces 118a and 124a or surfaces 118b and 124b) coincide. The first and second surfaces 124a, 124b of the reinforcing member 124 may be arranged over the first and second surfaces 110b, 110c of the support structure 110 such that the circular holes of the reinforcing member 124 coincide with the dome-shaped recesses of the support structure 110 to allow the ends of the shafts 106, 108 including the pins 134, 136 to extend through. Further, as shown, in various embodiments, the first and second extension members 118c, 118d of the printed circuit board 118 may be arranged over the first and second extension members 124c, 124d of the reinforcing member 124 respectively. In various embodiments, the printed circuit board 118 may be connected to the support structure 110 via the reinforcing member 124. For example, the printed circuit board 118 may be connected to the reinforcing member 124 and the reinforcing member 124 may in turn be connected to the support structure 110. In various embodiments, the printed circuit board 118 may be connected to the reinforcing member 124 via a pin and hole locator. For example, the first and second surfaces 124a, 124b of the reinforcing member 124 may include a plurality of pins 140, and the first and second surfaces 118a, 118b of the printed circuit board 118 may include a plurality of holes 138 at locations corresponding to the locations of the pins 140. To connect the printed circuit board 118 to the reinforcing member 124, the pins 140 may be fitted through the holes 138. In various embodiments, double-sided adhesive may be provided between the reinforcing member 124 and the printed circuit board 118 to further secure them together.

As shown, in various embodiments, the inductive joystick 100 may further include a base 128 to which the elongate member 104 is coupled. In various embodiments, the base 128 may be in the form of a bottom case. As shown, the base 128 may be arranged at a level substantially in a middle of the side plates 110b, 110c, 110d, 110e of the support structure 110 (in other words, substantially in a middle of the first and second surfaces 118a, 118b of the printed circuit board 118 and substantially in a middle of the first and second surfaces 124a, 124b of the reinforcing member 124). The base 128 may be coupled with the support structure 110 by securing protrusions on the base 128 with corresponding holes on the support structure 110. In various embodiments, the inductive joystick 100 may further include a spring plate 114 coupled to the base 128 and a spring 112 arranged over the spring plate 114. As shown, the elongate member 104 may be coupled to the base 128 via the spring 112 and the spring plate 114 to allow the elongate member 104 to be movable in the first and second directions (X and Y directions).

In various embodiments, the joystick 100 may further include a mid switch 126 in connection with the base 128 of the inductive joystick 100. The mid-switch 126 may be an add-on feature of the joystick 100 to provide further input to the processor-based device the joystick 100 is in communication with. For example, a user may employ the joystick 100 to input commands to an air warfare game application running on the processor-based device. In this example, the elongate member 104 may be used to manoeuver a fighter plane in a similar manner as an actual joystick of the fighter plane, whereas the mid-switch 126 may be used as a push button to control weaponry of the fighter plane, for example, to fire missiles from the fighter plane.

Figure 2A:
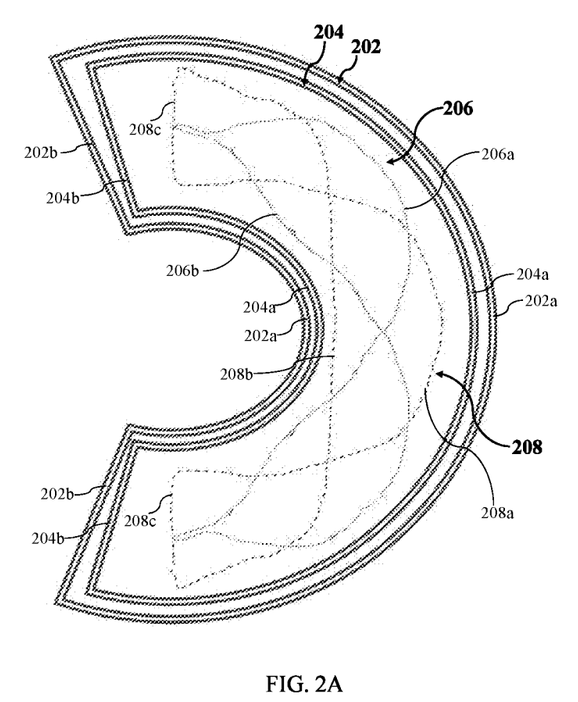
FIG. 2A shows a side view of coils that the inductive joystick of FIGS. 1A-1B may be provided with according to various embodiments.
Figure 2B:
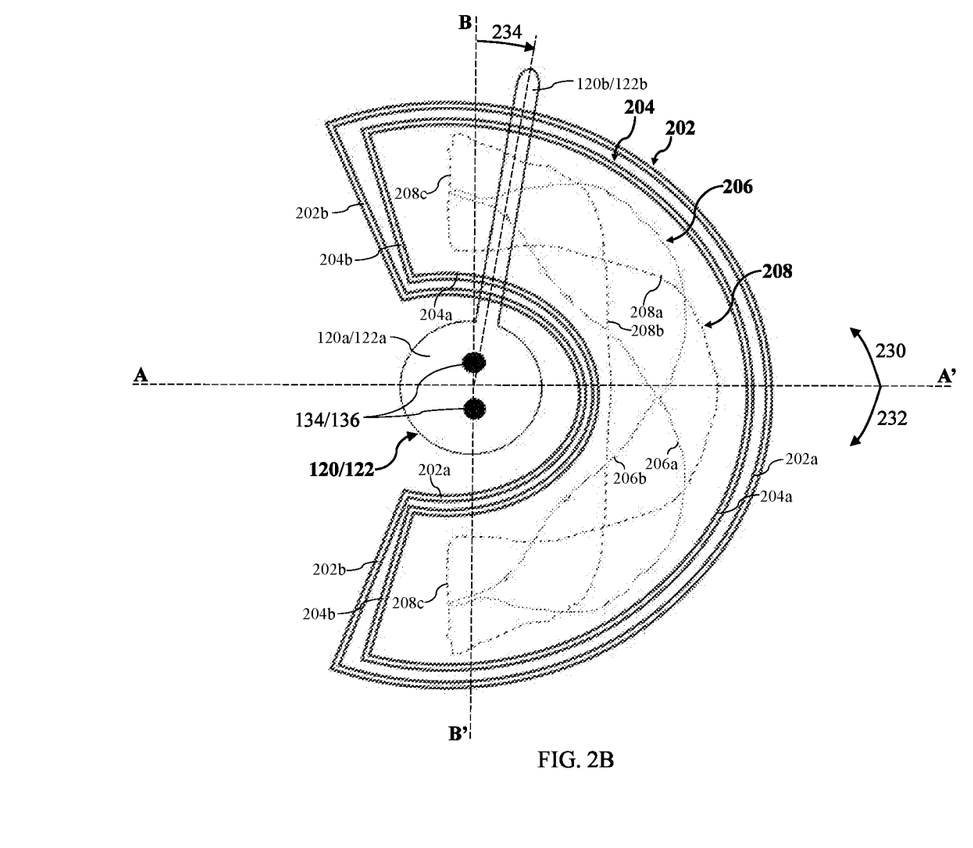
FIG. 2B shows a side view of the coils of FIG. 2A with a metal dial of the inductive joystick.
Figure 2C:
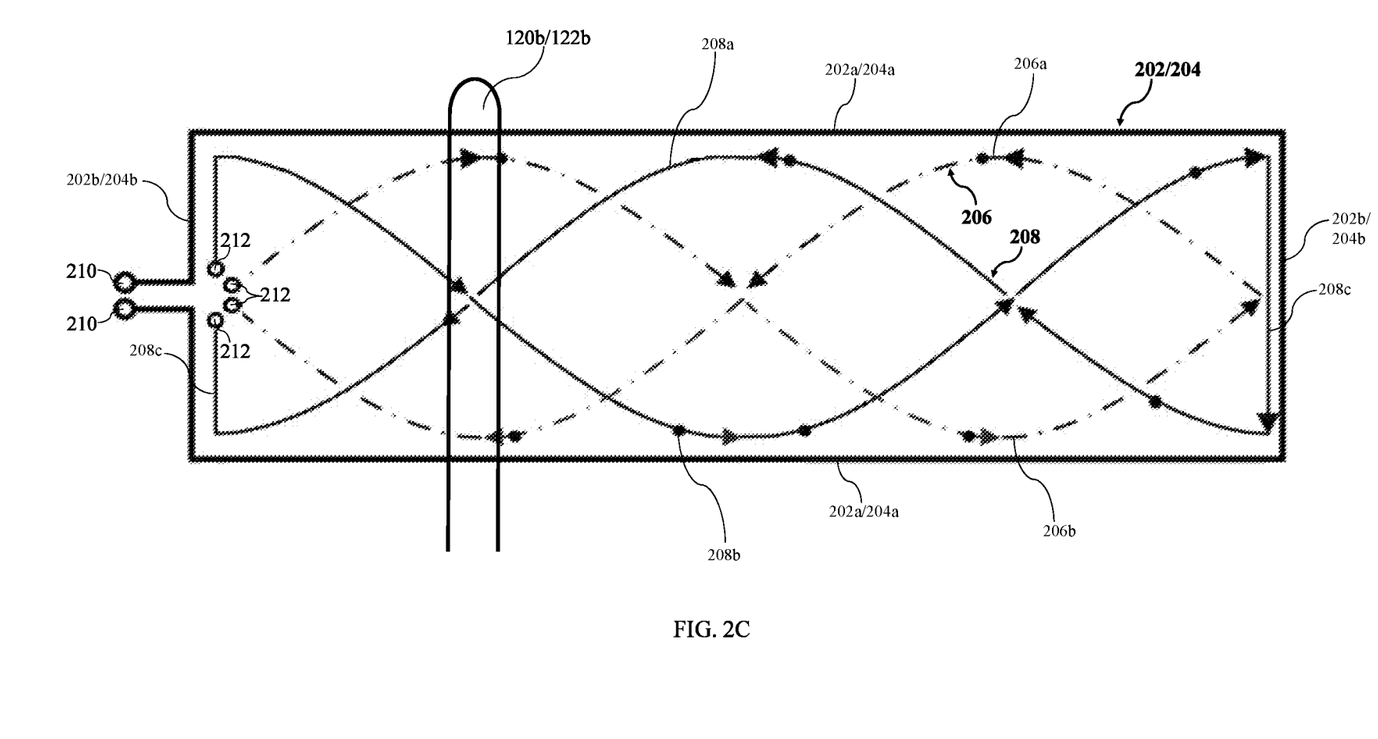
FIG. 2C shows a schematic view of the coils of FIGS. 2A and 2B with a portion of the metal dial of FIG. 2B.

FIG. 2A shows a side view of the at least one transmitter coil 202/204 and the at least one receiver coil 206/208 that each of the first and second surfaces 118a, 118b of the printed circuit board 118 may be provided with in various embodiments. FIG. 2B shows an example arrangement of the metal dial 120/122 with the at least one transmitter coil 202/204 and the at least one receiver coil 206/208 of FIG. 2A. FIG. 2C shows a schematic diagram of the at least one transmitter coil 202/204 and the at least one receiver coil 206/208 of FIG. 2A, together with the base portion 120b/122b of the metal dial 120/122. As shown in FIG. 2A, the at least one transmitter coil 202/204 and the at least one receiver coil 206/208 may be arranged in a curvilinear manner. However, for simplicity, the at least one transmitter coil 202/204 and the at least one receiver coil 206/208 are shown in a linear manner in FIG. 2C.

As shown, in various embodiments, the at least one transmitter coil 202/204 may include a first transmitter coil 202 and a second transmitter coil 204. However, in alternative embodiments, the at least one transmitter coil may include only one transmitter coil or more than two transmitter coils. In various embodiments, the at least one transmitter coil 202/204 may include at least four turns. For example, as shown, the first transmitter coil 202 may include two curved portions 202a and two linear portions 202b between the ends of the curved portions 202a. Accordingly, the first transmitter coil 202 may include four turns, each turn at where a curved portion 202a is joined with a linear portion 202b. The second transmitter coil 204 may similarly include two curved portions 204a and two linear portions 204b between the curved portions 204a. In other words, the second transmitter coil 204 may also include four turns. As shown, the second transmitter coil 204 may completely surround the first transmitter coil 202.

In various embodiments, the at least one receiver coil 206/208 may include a first receiver coil 206 and a second receiver coil 208. However, in alternative embodiments, the at least one receiver coil may include only one receiver coil or more than two receiver coils. In various embodiments, the at least one receiver coil 206/208 may include a sine coil and a cosine coil. For example, as shown, the first receiver coil 206 may include a sine coil and the second receiver coil 208 may include a cosine coil. As shown, in various embodiments, each receiver coil 206, 208 may include at least one turn. For example, the first receiver coil 206 may include a first portion 206a in the shape of a first sine curve and a second portion 206b in the shape of a second sine curve, wherein the first and second sine curves may be 180 degrees out of phase. Further, the first and second sine curves may be joined at one end. Accordingly, the first receiver coil 206 may include one turn at where the first and second sine curves are joined. The second receiver coil 208 may similarly include a first portion 208a in the shape of a first cosine curve and a second portion 208b in the shape of a second cosine curve, wherein the first and second cosine curves may be 180 degrees out of phase. Unlike the first receiver coil 206, the second receiver coil 208 may further include intermediate linear portions 208c between the first and second portions 208a, 208b. Accordingly, the second receiver coil 208 may include two turns, each turn at where the portion 208a, 208b in the shape of a cosine curve joins the linear portion 208c. As shown in FIG. 2B, in various embodiments, each transmitter coil 202, 204 may be connected to first contacts 210, and each receiver coil 206, 208 may be connected to second contacts 212. For simplicity, these contacts 210, 212 are not shown in FIG. 2A and FIG. 2B.

Referring to FIG. 2B, in various embodiments, when the elongate member 104 is at rest, the elongate element 120b/122b of the metal dial 120/122 may lie over the axis A-A', where the axis A-A' may be through a centre of the base portion 120a/122a of the metal dial 120/122 and may be parallel to the first or second direction (X or Y direction). When the elongate member 104 is moved, the elongate element 120b/122b of the metal dial 120/122 may move along a plane parallel to the respective surface 118a/118b of the printed circuit board 118. In various embodiments, the elongate element 120b/122b of the metal dial 120/122 may move without contacting the respective surface 118a/118b. In various embodiments, the elongate element 120b/122b of the metal dial 120/122 may move either upwards at a positive angle 230 about the axis A-A' or downwards at a negative angle 232 about the axis A-A'. In other words, the position of the elongate element 120b/122b of the metal dial 120/122 may be represented by the positive angle 230 or the negative angle 232. Alternatively, the position of the elongate element 120b/122b of the metal dial 120/122 may be represented by the angle 234 relative to the axis B-B', where the axis B-B' may be through a centre of the base portion 120a/122a of the metal dial 120/122 and may be perpendicular to the first or second direction (X or Y direction). In various embodiments, each of the first and second metal dials 120, 122 may be movable between a first position and a second position. In various embodiments, the first position may be where the positive angle 230 is about 65 degrees (in other words, where the angle 234 is about 25 degrees) and the second position may be where the negative angle 230 is about −65 degrees (in other words, where the angle 234 is about 155 degrees). Said differently, the range of movement of the metal dial 120/122 may be about 130 degrees. However, the first and second positions, and the range of movement of the metal dial 120/122 may be different in other embodiments. For example, in some alternative embodiments, the range of movement of the metal dial 120/122 may be less than 130 degrees, whereas in other alternative embodiments, the range of movement of the metal dial 120/122 may be more than 130 degrees. For example, in some embodiments, the first position may be where the positive angle 230 is about 23 degrees (in other words, where the angle 234 is about 67 degrees) and the second position may be where the negative angle 230 is about −23 degrees (in other words, where the angle 234 is about 113 degrees).

Figure 3:
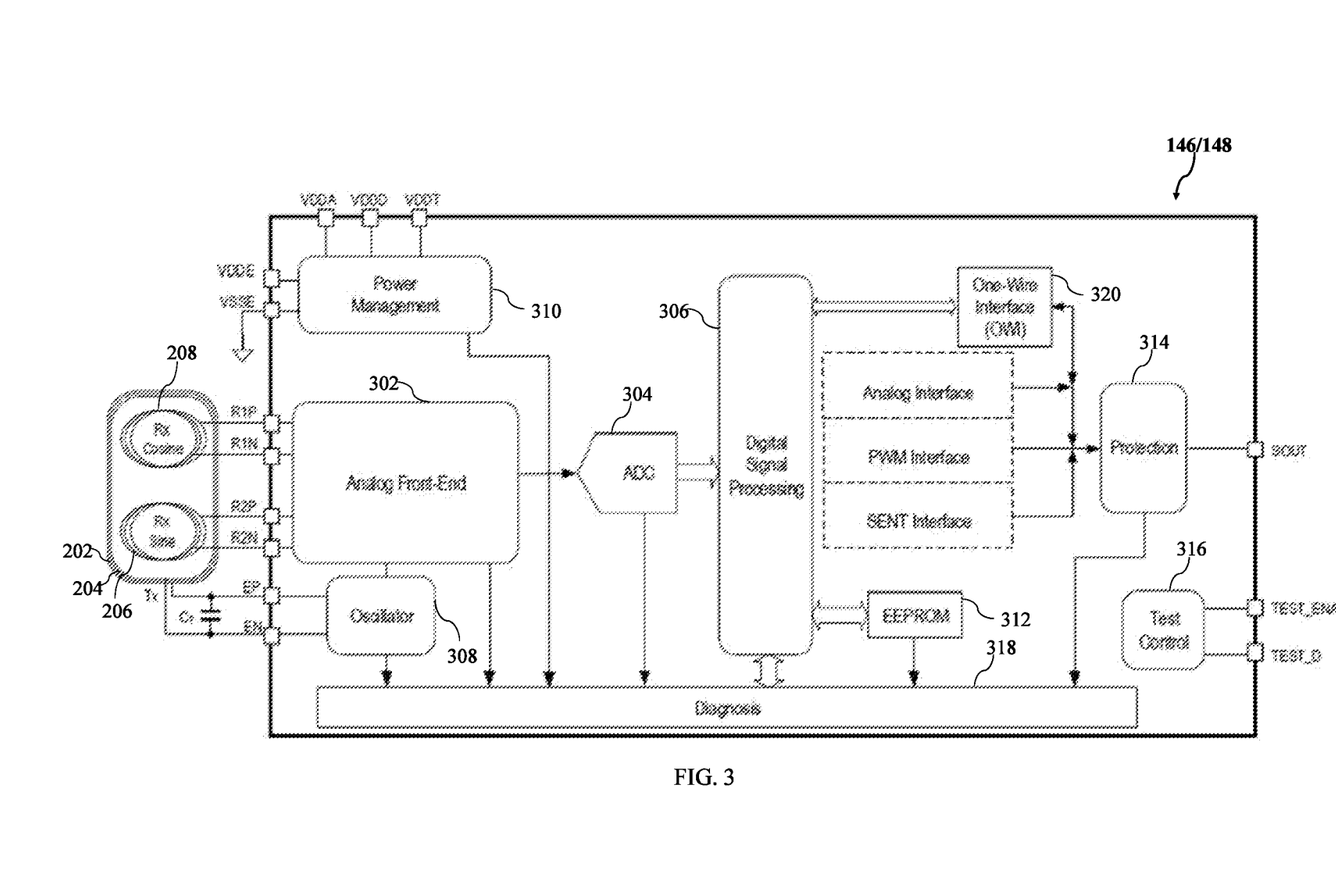
FIG. 3 shows an example implementation of a chip of the inductive joystick of FIGS. 1A-1B.

FIG. 3 shows an example implementation of the chip 146/148. As shown, in the example implementation, the chip 146/148 may include a first processing unit 302 that may be an analog front-end unit, a conversion unit 304 that may be an analog-to-digital convertor, a second processing unit 306 that may be a digital signal processing unit, an oscillator 308 that may be an inductor-capacitor (LC) oscillator, a power management unit 310, a memory unit 312 that may be an EEPROM, a protection unit 314, a test control unit 316, a diagnosis unit 318 and an interface 320 in the form of a one-wire interface (OWI). However, the chip 146/148 need not include all of the units 302-320 as shown in FIG. 3. For example, the oscillator 308 may not be part of the inductive joystick 100 and may instead be a separate unit connected to the joystick 100. Similarly, the second processing unit 306 may not be part of the inductive joystick 100 and may instead be a separate unit connected to the joystick 100. As shown, in various embodiments, the chip 146/148 may be electrically connected to the transmitter coils 202, 204 and the receiver coils 206, 208. For example, the oscillator 308 may be connected to the transmitter coils 202, 204 and the first processing unit 302 may be connected to the receiver coils 206, 208.

In various embodiments, the at least one transmitter coil 202/204 may be configured to receive an alternating signal from the oscillator 308. In various embodiments, a frequency of the alternating signal may be about 5 MHz. In various embodiments, the at least one transmitter coil 202/204 may be configured to induce at least one signal in the at least one receiver coil 206/208. For example, the alternating signal received by the at least one transmitter coil 202/204 may generate a magnetic field in the at least one transmitter coil 202/204. The magnetic field may induce secondary currents in various segments of the at least one receiver coil 206/208. Accordingly, at least one signal including these secondary currents may be induced in the at least one receiver coil 206/208. For example, the magnetic field generated in the first and second transmitter coils 202, 204 may induce a first signal in the first receiver coil 206 and a second signal in the second receiver coil 208. In various embodiments, the at least one metal dial 120/122 may be configured to interfere with the induction of the at least one signal in the at least one receiver coil 206/208. For example, for each of the first and second surfaces 118a, 118b of the printed circuit board 118, when the metal dial 120/122 is positioned over a segment of the first receiver coil 206 and a segment of the second receiver coil 208, the magnetic field generated in the transmitter coils 202, 204 may induce eddy currents in the metal dial 120/122 and may not induce secondary currents in the segments of the receiver coils 206, 208 the metal dial 120/122 is over. This may affect the induced signals in the receiver coils 206, 208 and the manner in which the induced signals may be affected may depend on the segments of the receiver coils 206, 208 the metal dial 120/122 is over. Accordingly, for each of the first and second surfaces 118a, 118b of the printed circuit board 118, relative movement between the surface 118a/118b and the metal dial 120/122 may vary the at least one induced signal based on a position of the metal dial 120/122. In other words, the at least one induced signal may be indicative of a position of the metal dial 120/122. For example, the at least one induced signal may include a first signal in the first receiver coil 202 and a second signal in the second receiver coil 204, and the differential phases and amplitudes of the first and second signals may be indicative of the position of the at least one metal dial 120/122.

In various embodiments, the at least one induced signal may include at least one analogue signal. For example, the at least one induced signal may include a first analogue signal induced in the first receiver coil 206 and a second analogue signal induced in the second receiver coil 208. The analogue signals may include sine data values and cosine data values. For example, the first analogue signal induced in the first receiver coil 206 may include sine data values and the second analogue signal induced in the second receiver coil 208 may include cosine data values.

Figure 4:
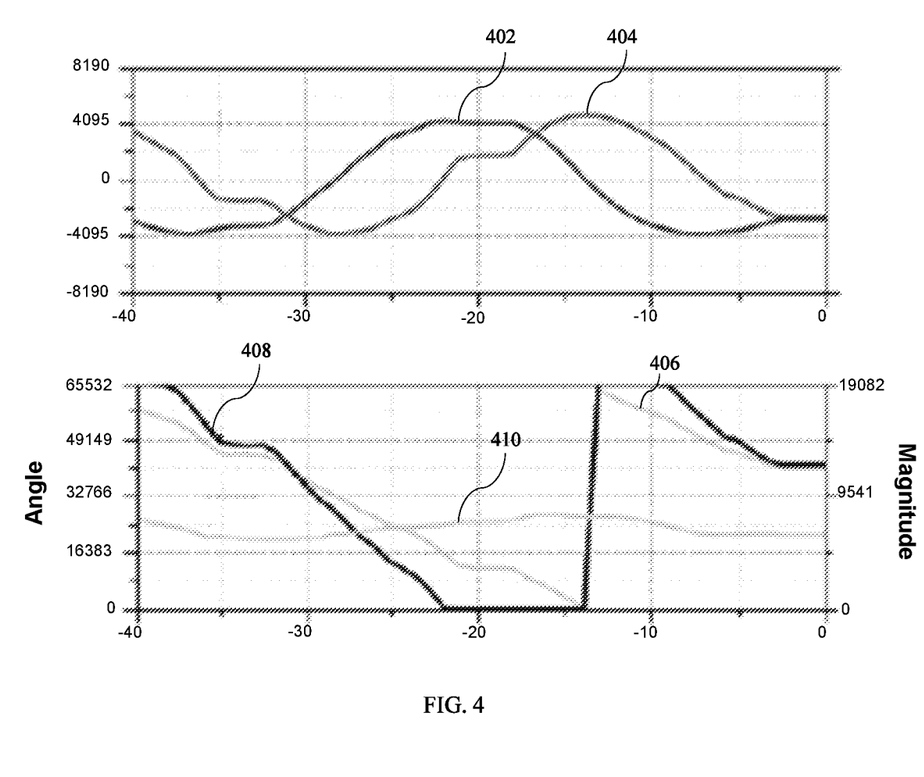
FIG. 4 shows an example of signals in the coils of FIGS. 2A-2C.

FIG. 4 shows an example of a first analogue signal 402 including sine data values and a second analogue signal 404 including cosine data values. In various embodiments, the first processing unit 302 may be configured to process the analogue signals. In various embodiments, the analogue signals including the sine and cosine data values may be converted into signals including values for the angle 234 shown in FIG. 2B. FIG. 4 further shows an example of signals 406, 408 including values for the angle 234, and a signal 410 that is a combination of the signals 406, 408. In various embodiments, the second processing unit 306 may be configured to process the at least one induced signal for each surface 118a/118b to determine the position of the metal dial 120/122 over the surface 118a/118b using a predetermined map. For example, the conversion unit 304 may be configured to convert the processed analogue signals to digital signals, and the second processing unit 306 may be configured to process the digital signals to determine the position of each metal dial 120, 122 using a predetermined map. In various embodiments, the output from the processing unit 306 may be received by the interface 320. In some embodiments, the output from the processing unit 306 may be converted into analogue signals before being received by the interface 320. In other embodiments, the output from the processing unit 306 may be received by the interface 320 in its digital form.

In various embodiments, the predetermined map may be calculated by the second processing unit 306 in a calibration process performed prior to using the inductive joystick 100. In various embodiments, the predetermined map may describe a relationship between the values for the angle 234 (or alternatively, the sine and cosine data values) and the position of the at least one metal dial 120/122 in an alternative representation (for example, in decimal numeral). In various embodiments, the at least one metal dial 120/122 may be movable between a first position and a second position, and the predetermined map may indicate only the positions between the first and second positions. This may help increase the dynamic range and resolution of the predetermined map. In turn, the accuracy of the joystick 100 may improve and the size of the dead zone may be reduced.

Figure 5:
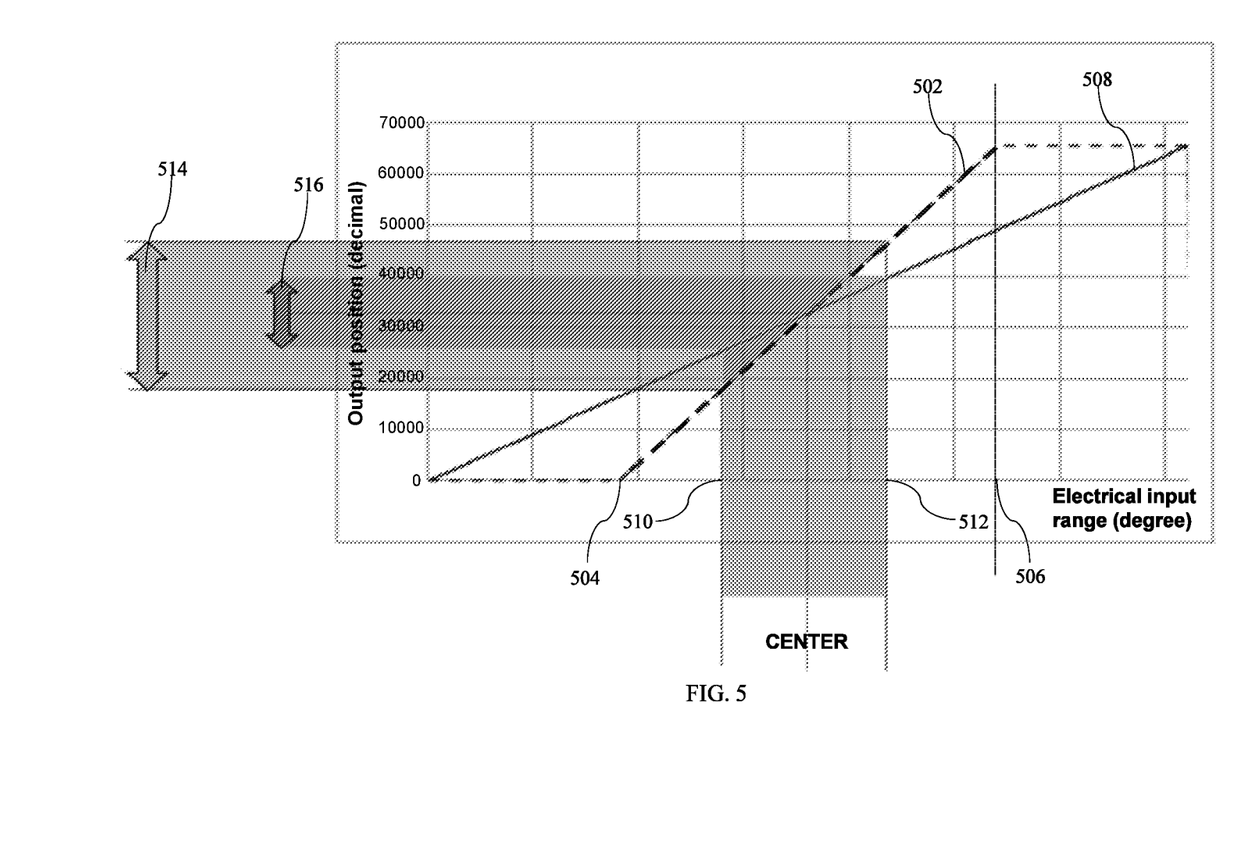
FIG. 5 shows an example of a predetermined map describing a relationship between signals in the coils of FIGS. 2A-2C and the position of the metal dial of FIG. 2B.

FIG. 5 shows an example of a predetermined map 502 describing a relationship between values for the angle 234 (along the x-axis labelled "Electrical input range (degrees)") and the position of the at least one metal dial 120/122 in decimal numeral (along the y axis labelled "Output position (decimal)"). In this example, the metal dial 120/122 may be movable between a first position (corresponding to the point 504 along the x axis) and a second position (corresponding to the point 506 along the x axis). As shown, the map 502 may indicate only the positions between the first position and the second position. FIG. 5 further shows a map 508 indicating all the positions from where the angle 234 is 0 degree to where the angle 234 is 360 degrees. As shown, the dynamic range provided by the map 502 may be greater than the dynamic range provided by the map 508. For example, as shown, when the at least one metal dial 120/122 moves between a position corresponding to the point 510 along the x axis and a position corresponding to the point 512 along the x axis, the dynamic range 514 provided by the map 502 is wider than the dynamic range 516 provided by the map 508.

Although the elongate member 104 of the inductive joystick 100 in FIGS. 1A and 1B is shown to be movable along two directions (X and Y directions), in alternative embodiments, the elongate member 104 may be movable along only a single direction substantially perpendicular to a length of the elongate member 104. Accordingly, the printed circuit board 118 of the inductive joystick 100 may include only one surface and one metal dial. In yet alternative embodiments, the elongate member 104 may be movable along more than two directions substantially perpendicular to a length of the elongate member 104, and in these embodiments, the inductive joystick 100 may include more than two surfaces and more than two metal dials, each metal dial arranged over one of the surfaces.

The following examples pertain to various embodiments.

Example 1 is an inductive joystick including:
a control structure including an elongate member movable along at least one direction substantially perpendicular to a length of the elongate member; and
a position sensing assembly including:
  a printed circuit board having at least one surface arranged adjacent to the control structure, wherein the at least one surface is substantially parallel with the length of the elongate member and with the at least one direction; and
  at least one metal dial arranged over the at least one surface;
wherein the control structure is coupled with the position sensing assembly such that movement of the elongate member along the at least one direction causes relative movement between the at least one surface and the at least one metal dial;
wherein the at least one surface of the printed circuit board is provided with at least one transmitter coil and at least one receiver coil, and wherein the at least one transmitter coil is configured to induce at least one signal in the at least one receiver coil, and the at least one metal dial is configured to interfere with the induction of the at least one signal such that relative movement between the at least one surface and the at least one metal dial varies the at least one induced signal based on a position of the at least one metal dial.

In Example 2, the subject matter of Example 1 may optionally include that the inductive joystick may further include a plurality of electrical components and the printed circuit board may further include at least one extension member extending from the at least one surface to hold the plurality of electrical components.

In Example 3, the subject matter of Example 2 may optionally include that the at least one extension member may be substantially perpendicular to the at least one surface.

In Example 4, the subject matter of any one of Examples 1 to 3 may optionally include that the at least one metal dial may be connected to the control structure such that movement of the elongate member along the at least one direction may cause movement of the at least one metal dial over the at least one surface.

In Example 5, the subject matter of any one of Examples 1 to 4 may optionally include that the at least one metal dial may include a base portion connected to the control structure; and an elongate element extending from the base portion; wherein movement of the elongate member along the at least one direction may cause rotation of the base portion to move the elongate element over the at least one transmission coil and the at least one receiver coil.

In Example 6, the subject matter of any one of Examples 1 to 5 may optionally include that the inductive joystick may further include at least one plastic pin connecting the at least one metal dial to the control structure.

In Example 7, the subject matter of any one of Examples 1 to 6 may optionally include that the control structure may further include a shaft configured to rotate about an axis substantially perpendicular to the at least one direction upon movement of the elongate member along the at least one direction, and the at least one metal dial may be connected to the shaft.

In Example 8, the subject matter of any one of Examples 1 to 7 may optionally include that the inductive joystick may further include a support structure surrounding the control structure and the printed circuit board may be connected to the support structure.

In Example 9, the subject matter of Example 8 may optionally include that the inductive joystick may further include a reinforcing member connected between the printed circuit board and the support structure.

In Example 10, the subject matter of any one of Examples 1 to 9 may optionally include that the inductive joystick may further include a base to which the elongate member is coupled and the base may be arranged at a level substantially in a middle of the at least one surface.

In Example 11, the subject matter of any one of Examples 1 to 10 may optionally include that the at least one transmitter coil may include at least four turns.

In Example 12, the subject matter of any one of Examples 1 to 11 may optionally include that the at least one receiver coil may include a sine coil and a cosine coil.

In Example 13, the subject matter of any one of Examples 1 to 12 may optionally include that the at least one metal dial may be movable between a first position and a second position, and the inductive joystick may further include a processing unit configured to process the at least one induced signal to determine the position of the at least one metal dial based on a predetermined map, wherein the predetermined map may indicate the positions between the first and second positions.

In Example 14, the subject matter of any one of Examples 1 to 13 may optionally include that the inductive joystick may further include a mid-switch in connection with a base of the inductive joystick.

In Example 15, the subject matter of any one of Examples 1 to 14 may optionally include that the elongate member may be movable along a first direction and a second direction, the at least one surface may include a first surface and a second surface, the first surface may be coupled with the second surface to surround at least a part of the control structure and the at least one metal dial may include a first metal dial arranged over the first surface and a second metal dial arranged over the second surface.

In Example 16, the subject matter of Example 15 may include that the printed circuit board may include a connecting member connecting the first and second surfaces.

In Example 17, the subject matter of Example 15 may include that the printed circuit board may include a flex cable.

Various embodiments have provided an inductive joystick which may have a longer lifespan and greater accuracy.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. An inductive joystick comprising:
a control structure comprising an elongate member movable along at least one direction substantially perpendicular to a length of the elongate member; and
a position sensing assembly comprising:
 a printed circuit board having at least one surface arranged adjacent to the control structure, wherein the at least one surface is substantially parallel with the length of the elongate member and with the at least one direction; and
 at least one metal dial arranged over the at least one surface;
wherein the control structure is coupled with the position sensing assembly such that movement of the elongate member along the at least one direction causes relative movement between the at least one surface and the at least one metal dial;
wherein the at least one surface of the printed circuit board is provided with at least one transmitter coil and at least one receiver coil, and wherein the at least one transmitter coil is configured to induce at least one signal in the at least one receiver coil, and the at least one metal dial is configured to interfere with the induction of the at least one signal such that relative movement between the at least one surface and the at least one metal dial varies the at least one induced signal based on a position of the at least one metal dial.

2. The inductive joystick according to claim 1, further comprising a plurality of electrical components and wherein the printed circuit board further comprises at least one extension member extending from the at least one surface to hold the plurality of electrical components.

3. The inductive joystick according to claim 2, wherein the at least one extension member is substantially perpendicular to the at least one surface.

4. The inductive joystick according to claim 1, wherein the at least one metal dial is connected to the control structure such that movement of the elongate member along the at least one direction causes movement of the at least one metal dial over the at least one surface.

5. The inductive joystick according to claim 1, wherein the at least one metal dial comprises:
   a base portion connected to the control structure; and
   an elongate element extending from the base portion;
   wherein movement of the elongate member along the at least one direction causes rotation of the base portion to move the elongate element over the at least one transmission coil and the at least one receiver coil.

6. The inductive joystick according to claim 1, further comprising at least one plastic pin connecting the at least one metal dial to the control structure.

7. The inductive joystick according to claim 1, wherein the control structure further comprises a shaft configured to rotate about an axis substantially perpendicular to the at least one direction upon movement of the elongate member along the at least one direction, and wherein the at least one metal dial is connected to the shaft.

8. The inductive joystick according to claim 1, further comprising a support structure surrounding the control structure and wherein the printed circuit board is connected to the support structure.

9. The inductive joystick according to claim 8, further comprising a reinforcing member connected between the printed circuit board and the support structure.

10. The inductive joystick according to claim 1, further comprising a base to which the elongate member is coupled and wherein the base is arranged at a level substantially in a middle of the at least one surface.

11. The inductive joystick according to claim 1, wherein the at least one transmitter coil comprises at least four turns.

12. The inductive joystick according to claim 1, wherein the at least one receiver coil comprises a sine coil and a cosine coil.

13. The inductive joystick according to claim 1, wherein the at least one metal dial is movable between a first position and a second position, and wherein the inductive joystick further comprises a processing unit configured to process the at least one induced signal to determine the position of the at least one metal dial based on a predetermined map, wherein the predetermined map indicates the positions between the first and second positions.

14. The inductive joystick according to claim 1, further comprising a mid-switch in connection with a base of the inductive joystick.

15. The inductive joystick according to claim 1, wherein the elongate member is movable along a first direction and a second direction, wherein the at least one surface comprises a first surface and a second surface, the first surface coupled with the second surface to surround at least a part of the control structure and wherein the at least one metal dial comprises a first metal dial arranged over the first surface and a second metal dial arranged over the second surface.

16. The inductive joystick according to claim 15, wherein the printed circuit board comprises a connecting member connecting the first and second surfaces.

17. The inductive joystick according to claim 15, wherein the printed circuit board comprises a flex cable.

18. An inductive joystick comprising:
   a control structure comprising an elongate member movable along a first direction and a second direction, wherein the first and second directions are substantially perpendicular to a length of the elongate member; and
   a position sensing assembly comprising:
      a printed circuit board having a first surface and a second surface arranged adjacent to the control structure, wherein the first and second surfaces are substantially parallel with the length of the elongate member and with the first and second directions respectively, and wherein the first surface is coupled with the second surface such that the printed circuit board surrounds at least part of the control structure;
      a first metal dial arranged over the first surface; and
      a second metal dial arranged over the second surface;
   wherein each of the first and second surfaces is provided with at least one transmitter coil and at least one receiver coil;
   wherein the control structure is coupled with the position sensing assembly such that movement of the elongate member along the first or second direction causes relative movement between the surface parallel with the direction and the metal dial arranged over the surface; and
   wherein for each of the first and second surfaces, the at least one transmitter coil is configured to induce at least one signal in the at least one receiver coil, and the at least one metal dial is configured to interfere with the induction of the at least one signal such that relative movement between the surface and the metal dial varies the at least one induced signal based on a position of the metal dial.

19. The inductive joystick according to claim 18, wherein each of the first and second metal dials comprises:
   a base portion connected to the control structure; and
   an elongate element extending from the base portion,
   wherein movement of the elongate member along the first direction causes rotation of the base portion of the metal dial arranged over the first surface to move the elongate element of the metal dial over the at least one transmitter coil and the at least one receiver coil of the first surface, and movement of the elongate member along the second direction causes rotation of the base portion of the metal dial arranged over the second surface to move the elongate element of the metal dial over the at least one transmitter coil and the at least one receiver coil of the second surface.

20. An inductive joystick comprising:
   a control structure comprising an elongate member movable along at least one direction substantially perpendicular to a length of the elongate member; and
   a position sensing assembly comprising:
      a printed circuit board having at least one surface arranged adjacent to the control structure, wherein the at least one surface is substantially parallel with the length of the elongate member and with the at least one direction; and
      at least one metal dial arranged over the at least one surface;
   wherein the at least one metal dial is connected to the control structure such that movement of the elongate member along the at least one direction causes movement of the at least one metal dial over the at least one surface; and
   wherein the at least one surface of the printed circuit board is provided with at least one transmitter coil and at least one receiver coil and wherein the at least one transmitter coil is configured to induce at least one signal in the at least one receiver coil, and the at least one metal dial is configured to interfere with the induction of the at least one signal such that movement of the at least one metal dial over the at least one surface varies the at least one induced signal based on a position of the at least one metal dial.

\* \* \* \* \*